United States Patent
Tajima et al.

(10) Patent No.: US 8,289,085 B2
(45) Date of Patent: Oct. 16, 2012

(54) AMPLIFIER CIRCUIT

(75) Inventors: Yusuke Tajima, Acton, MA (US); John Muir, North Chelmsford, MA (US)

(73) Assignee: Auriga Measurement Systems, LLC, Chelmsford, MA (US)

(*) Notice: Subject to any disclaimer, the term of this patent is extended or adjusted under 35 U.S.C. 154(b) by 26 days.

(21) Appl. No.: 12/970,240

(22) Filed: Dec. 16, 2010

(65) Prior Publication Data

US 2011/0140784 A1    Jun. 16, 2011

Related U.S. Application Data

(60) Provisional application No. 61/286,839, filed on Dec. 16, 2009, provisional application No. 61/323,472, filed on Apr. 13, 2010.

(51) Int. Cl.
  *H03F 3/04* (2006.01)
(52) U.S. Cl. ...................... 330/301; 330/124 R
(58) Field of Classification Search ............ 330/84, 330/124 R, 295, 301
  See application file for complete search history.

(56) References Cited

U.S. PATENT DOCUMENTS

| | | | |
|---|---|---|---|
| 5,146,178 A | 9/1992 | Nojima et al. | |
| 5,796,304 A | 8/1998 | Gentzler | |
| 5,896,183 A | 4/1999 | Terk et al. | |
| 5,977,842 A | 11/1999 | Brown et al. | |
| 6,545,542 B2 * | 4/2003 | Matsuyoshi et al. | 330/301 |
| 6,710,650 B1 * | 3/2004 | Beaudin et al. | 330/124 R |
| 6,724,255 B2 | 4/2004 | Kee et al. | |
| 6,741,814 B1 | 5/2004 | Kosoff | |
| 6,806,768 B2 | 10/2004 | Klaren et al. | |
| 6,949,978 B2 * | 9/2005 | Tayrani et al. | 330/251 |
| 2002/0105384 A1 | 8/2002 | Dent | |
| 2004/0027199 A1 | 2/2004 | Wight et al. | |
| 2005/0083122 A1 | 4/2005 | Tayrani et al. | |
| 2006/0139092 A1 | 6/2006 | Sundstrom et al. | |
| 2008/0252382 A1 | 10/2008 | Takagi | |

(Continued)

FOREIGN PATENT DOCUMENTS

EP    1 521 360 A1    4/2005
(Continued)

OTHER PUBLICATIONS

Frebrowski, et al.; "Inverse Class F Power Amplifier in Push-Pull Configuration;" Nov. 2009 IEEE; International Conference on Signals, Circuits and Systems, p. 1-4.

(Continued)

*Primary Examiner* — Khanh V Nguyen
(74) *Attorney, Agent, or Firm* — Daly, Crowley, Mofford & Durkee, LLP

(57) ABSTRACT

An amplifier circuit includes a pair of amplifying devices, a first balun coupled between an input port of the amplifier circuit and RF input ports of the pair of amplifying devices and a second balun coupled between RF output ports of the pair of amplifying devices and an output port of the amplifier circuit wherein the first and second baluns are configured such that the amplifier circuit operates under open condition for signals at a second harmonic frequency even when the second harmonic frequency is within an operating frequency band of a fundamental frequency of the amplifier circuit. In one embodiment, the amplifier circuit includes a bypass circuit which selectively couples balun ports to ground such that in response to a first control signal, the amplifier circuit operates in an amplifying mode and in response to a second control signal, the amplifier circuit operates in a bypass mode.

15 Claims, 11 Drawing Sheets

U.S. PATENT DOCUMENTS

| | | |
|---|---|---|
| 2009/0102554 A1 | 4/2009 | Lejon |
| 2010/0007430 A1 | 1/2010 | Aoki |
| 2010/0156537 A1 | 6/2010 | Dishop |
| 2010/0194493 A1 | 8/2010 | Thompson |

FOREIGN PATENT DOCUMENTS

| | | |
|---|---|---|
| JP | 2003-037459 A | 2/2003 |
| WO | WO 2009/136326 A1 | 11/2009 |

OTHER PUBLICATIONS

Gentzler, et al.; "Broadband VHF/UHF Amplifier Design Using Coaxial Transformers;" May 2003 High Frequency Electronics; Summit Technical Media, LLC 6 pages.

Knochel; "A 2.14 GHz inverse class F Si-LDMOS power amplifier with voltage second harmonic peaking;" University of Kiel, Microwave Laboratory; Mar. 2006; 4 pages.

Kee, et al.; "7-MHz, 1.1-kW Demonstration of the New $E/F_{2,odd}$ Switching Amplifier Class:" IEEE MTT/S International Microwave Symposium; May 2001; 4 pages.

Ohta, et al.; "Intermodulation Distortion Analysis of Class-F and Inverse Class-F HBT Amplifiers;" IEEE Transactions on Microwave Theory and Techniques; vol. 53, No. 6; Jun. 2005; pp. 2121-2128.

"RF Power Field Effect Transistor;" Freescale Semiconductor, Inc.; Document No. MRF6VP11KH; Rev 5.; Jul. 2009; pp. 1-11.

Schmelzer, et al.; "A GaN HEMT Class F Amplifier at 2 GHz with > 80 % PAE;" IEEE Compound Semiconductor IC Symposium; 2006; 4 pages.

Stameroff, et al.; High Efficiency Push-Pull Inverse Class F Power Amplifier Using a Balun and Harmonic Trap Waveform Shaping Network; IEEE Jun. 2010; pp. 521-525.

"Three Balun Designs for Push-Pull Amplifiers;" Motorola, Inc.; AN1034/D; 1993; pp. 1-12.

Granberg; "Building Push-Pull, Multioctave, VHF Power Amplifiers;" Motorola Semiconductor Products, Inc.; No. AR305; Nov. 1987; 8 pages.

Storr; "Electronics-Tutorials about Class B Amplifiers;" http://www.electronics-tutorials.ws/amplifier/amp_6.html; Nov. 1998.

Invitation to Pay Additional Fees and Partial Search Report of the ISA for PCT/US2010/060753.

PCT Search Report of the ISA dated Aug. 3, 2011; for PCT/US2010/060753; 6 pages.

PCT Written Opinion of the ISA dated Aug. 3, 2011; for PCT/US2010/060753; 7 pages.

\* cited by examiner

AMPLIFIER CIRCUIT

CROSS REFERENCE TO RELATED APPLICATION

This application claims the benefit of provisional application No. 61/286,839 filed on Dec. 16, 2009 and provisional application No. 61/323,472 filed on Apr. 13, 2010 under 35 U.S.C. s. 119(e) which applications are hereby incorporated herein by reference in their entireties.

FIELD OF THE INVENTION

The structures and techniques described herein relate to radio frequency (RF) circuits and more particularly to RF amplifier circuits.

BACKGROUND OF THE INVENTION

As is known in the art, a radio frequency (RF) amplifier circuit receives an RF signal at an input thereof and provides an amplified version of the RF signal at an output thereof. Ideally, the RF input signal is provided having a single frequency (the so-called fundamental frequency) and does not include any harmonic frequently signal components. Similarly, ideally, the RF amplifier provides an amplified version of the fundamental frequency RF signal and does not generate any harmonics as a result of the amplification. In practical RF amplifier circuits however, harmonic frequency signal components exist.

When an RF input signal reaches a particular power level, the RF amplifier begins to operate in a non-linear amplification region. This results in the generation of harmonic frequency signal components. Thus, in some cases, it is desirable to provide the amplifier circuit with an RF signal path, sometimes referred to as bypass path, which can be used when amplification of a signal is not desired.

In a Class F amplifier configuration, when harmonic frequency signal components are terminated appropriately, the voltage waveform resembles a square wave and the overlap with the current waveform (conduction angle) becomes minimal. By virtue of the minimal conduction angle (the DC power dissipated), the efficiency can be very high with the theoretical maximum being 100% efficiency.

The Class F amplifiers are conventionally designed with harmonics terminated at the amplifier as follows: (a) a short circuit impedance characteristic is presented to even harmonics at an amplifier output terminal; (b) an open circuit impedance characteristic is presented to odd harmonics at the amplifier output terminal (except the fundamental signal frequency); (c) an output impedance characteristic of the amplifier is matched to a load at the fundamental signal frequency; and (d) a short circuit impedance characteristic is presented to harmonics at an input terminal of the amplifier.

The short circuited harmonics at the input are important because all high efficiency analysis assumes a sinusoidal drive at the amplifier input port. However, the amplifier input impedance can be as non-linear as the output impedance and a signal waveform can be easily distorted at the input, degrading the efficiency. Thus, to maintain a sinusoidal waveform at the input, all harmonics should be shorted.

As is also known, inverse Class F is a dual to standard Class F, where current and voltage waveforms are exchanged. This is realized by selecting the load conditions as follows: (a) open circuited even harmonics at the device output terminal; (b) short circuited odd harmonics at the device output terminal except for the fundamental; (c) matched to the load at the fundamental; and (d) open circuited at all harmonics at device input terminal.

An important harmonic signal in Class F and Inverse Class F is a signal having a frequency equal to a second harmonic of the fundamental signal frequency. The open condition required for the second harmonic for the Inverse Class F is similar to Class E. Therefore, there is a lot of commonality between Class E and Inverse Class F amplifiers.

As is known in the art, it is sometimes desirable to configure an RF amplifier circuit in a push-pull configuration. Balun circuits (or more simply "baluns") are often used with push-pull amplifiers to link a symmetrical (balanced) circuit to an asymmetrical (unbalanced) circuit.

SUMMARY OF THE INVENTION

In accordance with the concepts, circuits and techniques described herein, an amplifier circuit having an input port and an output port includes a pair of amplifying devices, each of the amplifying devices having an input and an output, an input balun coupled between the input port of the amplifier circuit and having first and second output ports coupled to respective ones of the input ports of the pair of amplifying devices and an output balun coupled between the output ports of the pair of amplifying devices and the output port of the amplifier circuit. The amplifier circuit further includes a bypass circuit coupled to the first and second output ports of the input balun and configured to selectively present first and second impedance characteristics to the first and second output ports of the input balun such that in response to the first impedance characteristic, RF signals fed to the input port of the input balun are coupled to respective ones of the first and second amplifying devices and in response to the second impedance characteristic, RF signals fed to the input port of the input balun are coupled to a bypass port of said input balun which is coupled to the output port of the amplifier circuit via an RF signal path.

In one embodiment, the input balun has an input port coupled to the input port of the amplifier circuit, a first output port selectively coupled to the input of a first one of said pair of amplifying devices, a second output port selectively coupled to the input of a second one of said pair of amplifying devices and a bypass port selectively coupled to the output port of the amplifier circuit. The amplifier circuit further includes a second balun having a first input port coupled to the output of the first one of said pair of amplifying devices, a second input port coupled to the output of the second one of said pair of amplifying devices and having an output port coupled to the output port of the amplifier circuit and In one embodiment, the bypass circuit comprises a switch element having a first terminal, a second terminal and a control terminal with the first terminal coupled to the first and second output ports of the input balun, the second terminal coupled to a reference potential and wherein in response to the control terminal receiving a control signal having a first value, the switch element couples the first and second output ports of said input balun to the reference potential. In one embodiment, the reference potential is ground.

In one embodiment, the switch element comprises a first diode coupled between the first output port of said input balun and ground and a second diode coupled between the second output port of said input balun and ground. Thus, In response to the first and second diodes being biased into their conductive states, the first and second diodes provide a low impedance signal path to ground to RF signals. Thus the first and second output ports of said input balun are effectively coupled to ground.

In one embodiment, the switch element comprises first and second transistors with a first transistor coupled between the first output port of the input balun and ground and the a second transistor coupled between the second output port of the input balun and ground. In response to the first and second transistors being biased into their conductive states, the first and second output ports of the input balun are coupled to ground.

In one embodiment, each of the pair of amplifying devices corresponds to a field effect transistor (FET) having gate, source and drain electrodes and the bypass circuit comprises a control circuit coupled to the gate electrodes of each of the FETs. In response to the control circuit providing a control signal to the gate electrodes of each FET, the FETs operate in a pinch-off transistor mode in which the FETs exhibit an open circuit impedance characteristic and thereby reflect the RF signals propagating along the signal path to the balun bypass port.

In one embodiment, when the RF input signal to the amplifying devices reaches a predetermined level (e.g. such that the RF input signal causes the amplifying devices to reach saturation such as 1 dB compression, 3 dB compression etc....) the control circuit provides a control signal to the bypass circuit to bypass the amplifying devices. Thus, it should be appreciated that the bypass circuit provides the amplifier circuit with a form of gain control.

In one embodiment, the bypass circuit is implemented using diodes. The diodes are coupled such that when they are biased into their conduction (aka low impedance) states, a short circuit signal path to ground to RF signals appearing at the output ports of the input balun. In this way the bypass circuit bypasses the amplifying devices.

In one embodiment, the amplifying devices are provided as FETs and the bypass circuit is implemented using a control circuit coupled to the gate electrodes of each of the FETs.

In some embodiments the amplifying devices may be provided as low noise amplifiers (LNAs).

In some embodiments it may be desirable to utilize signals from both the input and output sides of the amplifying devices to provide an input signal to the control circuit. In some embodiments, the circuit can be manually switched into bypass mode if a user feels as though one or more of the amplifying devices are saturating.

In one embodiment, once amplifiers are selected, the saturation characteristic(s) or other characteristics of the amplifiers are used to determine, at least in part, desired characteristics of the remaining circuits in the system.

In one embodiment, the circuit is designed to reduce effects of "friendly" signals (e.g. on a ship with multiple radars operating at multiple frequencies and power levels, this bypass mode can be used to reduce maintain the signal (e.g. a signal processor) in a desired range.

Switching elements may be provided as any type of electronic switch, for example, from one or more of (or a combination of) one or more diodes, one or more transistors (including one or more field effect transistors) or other two or three terminal devices. Switching elements may also be provided a mechanical switch. In one embodiment, switch characteristics are selected such that no significant signal degradation occurs in the RF signal path.

In one embodiment, the input balun has a first port corresponding to the input port of the amplifier circuit, a second port selectively coupled between ground and an input port of the first amplifying device a third port selectively coupled between ground and the input of the second amplifying device and a fourth port corresponding to a bypass port and selectively coupled to receive an RF input signal.

In response to the first control signal, the bypass port of the input balun is coupled to ground and the second and third ports of the input balun are coupled such that an RF signal provided to the input port of the input balun is coupled through the input balun to the first and second amplifying devices which are in turn coupled to a pair of input ports of the output balun. An amplified RF signal is coupled through the output balun and is provided the output port of the amplifier circuit.

In response to the second control signal, the bypass port of the input balun is to the output port of the amplifier circuit coupled and the second and third ports of the input balun are coupled to ground such that an RF signal provided to the input port of the input balun is directed to the bypass port of the input balun and subsequently.

In one embodiment, the input and output baluns are provided as coaxial baluns.

In one embodiment, the amplifier circuit further includes one or more switch circuits coupled to the input balun to allow the second, third and fourth ports of the input balun to be selectively coupled to ground. The one or more switch circuits are responsive to the first and second control signals such that the second, third and fourth ports of the input balun are selectively coupled to ground in response to the first and second control signals. With such an arrangement, the amplifier circuit operates in an amplifying mode in response to the first control signal and the amplifier circuit operates in a bypass mode in response to the second control signal.

In accordance with the concepts, circuits and techniques described herein, the approach described below includes operating an amplifier under open circuit impedance conditions for a second harmonic signal even when the second harmonic frequency is within an operating frequency band of the amplifier.

In accordance with the concepts, circuits and techniques described herein, an amplifier circuit includes a pair of amplifying devices, a first balun having an input port coupled to an input port of the amplifier circuit, a first output port coupled to an input of a first one of the pair of amplifying devices and a second output port coupled to an input of a second one of said pair of amplifying devices. The amplifier circuit further includes a second balun having a first input port coupled to an output of the first one of the amplifying devices, a second output port coupled to an output of the second one of the amplifying devices and having an output port coupled to an output port of the amplifier circuit. The amplifier may contain additional matching circuits in between the baluns and input/output ports in order to make the impedances matched to the system impedance which is typically 50 ohms. The fourth ports of the baluns at both input and output may be RF grounded by a large bypass capacitor and DC bias voltage necessary for the amplifiers can be connected to these ports.

The input balun receives an RF input signal provided thereto, splits the RF input signal into two equal amplitude signals having a 180 degree phase difference (i.e. the two equal amplitude signals are 180 degrees out of phase) and provides the signals to two amplifying devices. Fundamental components of output signals from the two amplifying devices are therefore out of phase. Second harmonic signal components, however, are in-phase. When the fundamental and second harmonic signals are injected to the second baluns, the fundamental signal will be combined at the output port and will be sent to the load presented at the port, but for the second harmonics, the balun will present an open circuit impedance and thus these signals will not appear at the output port. Similarly, the second harmonic generated by the device and returned to the input balun will be presented to an open circuit impedance condition. Therefore, with this particular arrangement, an amplifier having a second harmonic open circuit impedance at both input and output ports for any point in an operating frequency band is provided.

In one embodiment, the first and second baluns are broadband baluns and the amplifier circuit is provided as a broadband inverse class F amplifier. In one embodiment, the operating frequency band corresponds to 0.2 to 2.5 GHz.

It should be appreciated that using conventional inverse Class F amplifier circuits and design techniques, it is not possible to provide a second harmonic open circuit impedance for any point in an operating frequency band for a broadband application since the harmonic frequency may be within the operating band of the amplifier circuit and the amplifier circuit cannot discriminate the second harmonic of one signal from the fundamental of another.

Using the concepts, circuits and techniques described herein, however, the effect of providing a second harmonic open circuit impedance for any point in an operating frequency band for a broadband application is achieved. In particular, the circuit described herein discriminates the second harmonic of one signal from the fundamental of another even if they are at the same frequency. The circuit can thus present different termination conditions for each of the signals separately. For example, the circuit may present an open circuit impedance for a second harmonic signal and a matched impedance characteristic for a signal at a fundamental frequency. At the fundamental frequency, the circuit may not be matched to the small signal impedance but it can be made to match to the large signal optimum condition, or any other conditions that serve the requirements of the amplifier. At the second harmonic, the circuit may not present a perfect open circuit impedance characteristic due to physical limitations (e.g. circuit tolerances resultant from practical manufacturing techniques), especially near the band edges. But at least in the middle of the band, it should present an impedance that is relatively higher than the device impedance presented at the circuit. Therefore, the concepts, circuits and techniques described herein make possible a wideband, highly efficient amplifier.

In accordance with the techniques described herein, broadband baluns are directly connected to the input and output of the device. In one embodiment, a balun utilizes a pair of low impedance coaxial cables connected to each other at the input and output in a way that impedance matches to an unbalanced characteristic impedance ($Z_o$) at one end and a balanced impedance of ¼ $Z_o$ (or ⅛ $Z_o$ unbalanced impedance) at the other end. It should also be noted that in this embodiment, a single bias port for input and a single bias port for output can feed bias voltages to both devices through the balun in this configuration.

In preferred embodiments, the balun is provided having very broadband characteristics that can provide two out-of-phase signals of equal amplitudes. When terminated correctly, a good return loss is achieved over the same broad frequency band e.g. covering HF to upper C-band). Both radiation and conduction losses can be reduced and in some cases even minimized by the use of a coaxial cable. In one embodiment, having two baluns connected back-to-back in a 50 Ω system, the impedance level at the middle of the two baluns is 12.5 Ω balanced and broadband impedance transforming balun characteristics have been demonstrated between 0.01 to 2 GHz to have a return loss better than 15 dB and insertion loss less than 0.4 dB per balun.

In accordance with still further concepts, circuits and techniques described herein, an amplifier circuit includes a pair of amplifying devices, an input balun and an output balun and wherein ports of the input balun can be selectively coupled to ground such that in response to a first control signal, the amplifier circuit operates in an amplifying mode and in response to a second control signal, the amplifier circuit operates in a bypass mode.

DETAILED DESCRIPTION OF THE PREFERRED EMBODIMENTS

Figure 1:
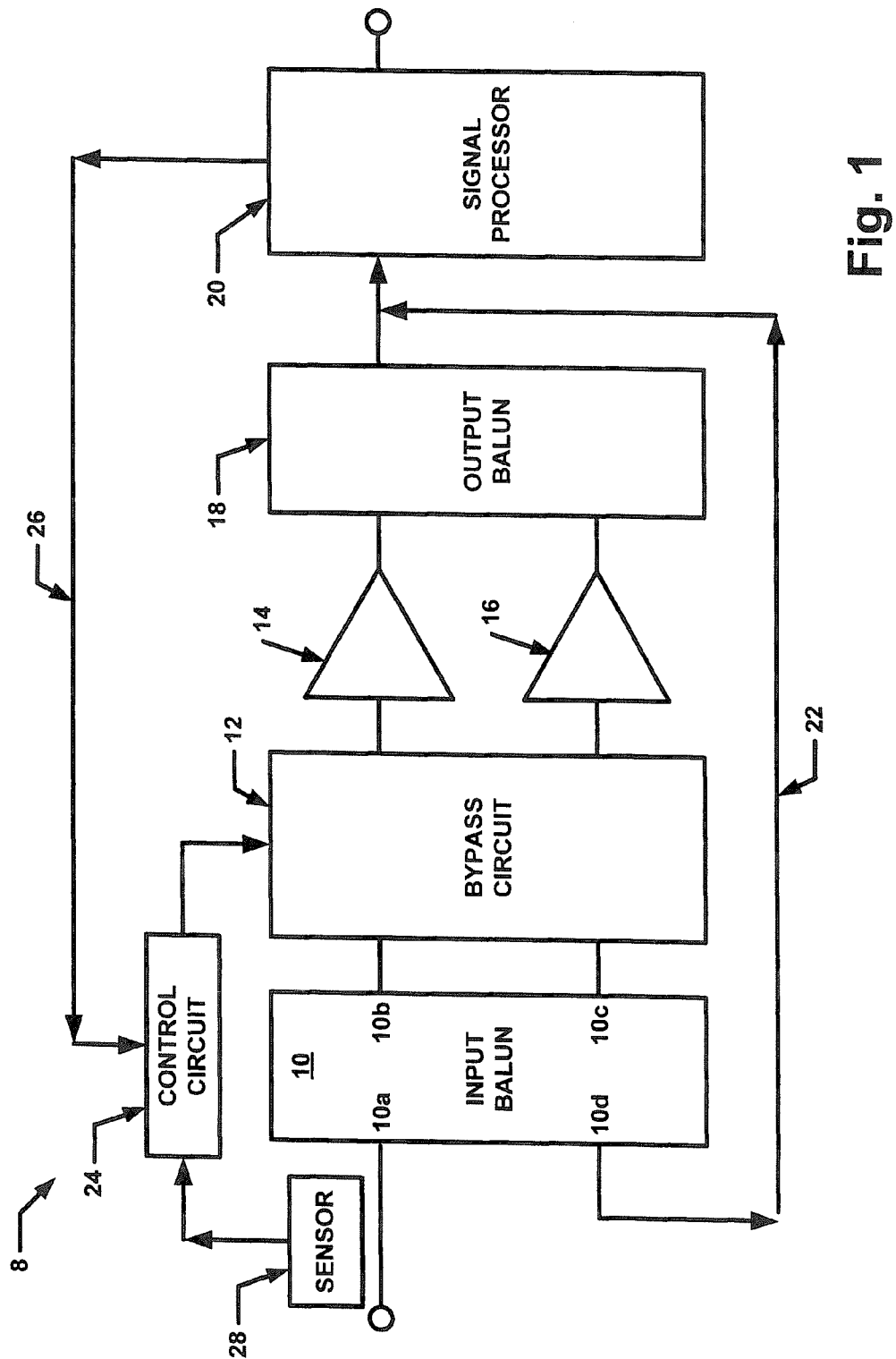
FIG. 1 is a block diagram of an amplifier circuit having input and output baluns and a bypass circuit.

Referring now to FIG. 1, a system 8 includes an input balun 10 having a first port 10a corresponding to a radio frequency (RF) input port second and third ports 10b, 10c and bypass port 10d. An RF signal provided to input port 10a propagates through balun 10 and appear at balun ports 10b, 10c as two equal amplitude signals which are 180 degrees out of phase. Balun ports 10b, 10c are coupled to first and second ports of a bypass circuit 12. Bypass circuit 12 operates in either an amplifying mode or a bypass mode.

With bypass circuit 12 in its amplifying mode, it provides signal paths having low insertion loss characteristics between balun ports 10b, 10c and respective input ports of amplifiers 14, 16. Bypass circuit 12 maintains the phase relationship of the two RF signals provided at input balun ports 10b, 10c. Thus, the signal paths between the output ports 10b, 10c of input balun 10 and the respective input ports of amplifiers 14, 16 are ideally phase and amplitude matched. In some embodiments the amplifiers 14, 16 may be provided as low noise amplifiers (LNAs). Amplifiers 14, 16 provide amplified RF signals to input ports 18a, 18b of output balun 18. Output balun 18 receives the signals provided thereto from amplifiers 14, 16, appropriately combines the signals and provides an RF output signal to an input of a signal processor 20 which processes the signal and provides an output signal at an output port 20a thereof.

With bypass circuit 12 in its bypass mode, it presents an impedance characteristic to signals fed thereto such that RF signals provided from balun ports 10b, 10c are reflected or otherwise re-directed to balun bypass port 10d which is coupled, via signal path 22, for example, to the input of processor 20 which processes the signal and provides an output signal at an output port 20a thereof. Thus, with bypass circuit 12 operating in its bypass mode, an RF signal provided to balun input port 10a is not coupled to amplifiers 14, 16, but instead is provided to the output port of the output balun (or alternatively may be provided directly to signal processor 20).

Bypass circuit 12 is switched between its amplifying mode and its bypass mode via a control circuit 24 which is coupled to bypass circuit 12 and provides one or more control signals thereto. Thus, in response to at least a first control signal provided by control circuit 24, bypass circuit 12 operates in its amplifying mode and in response to at least a second control signal provided by control circuit 24, bypass circuit 12 operates in its bypass mode.

In one embodiment, control circuit 24 receives a feedback signal along signal path 26 from either the output port of output balun 18 or, as shown in FIG. 1, from signal processor 20. If the feedback signal provided to control circuit 24 (from either the balun output or the signal processor) indicates that the amplitude of one or both of the RF signals from amplifiers 14, 16 equals or exceeds a predetermined threshold value, then control circuit 24 provides a control signal to bypass circuit such that bypass circuit 12 operates in its bypass mode. If, on the other hand, the feedback signal provided to control circuit 24 indicates that the amplitude of one or both of the RF signals from amplifiers 14, 16 is less than a predetermined threshold value, then control circuit 24 provides a control signal to bypass circuit 12 such that it operates in its amplifying mode. Thus, in this embodiment, the feedback signal is generated or otherwise derived from one or more signals on the output side of amplifiers 14, 16.

Alternatively, rather than receiving a feedback signal from the output side of amplifiers 14, 16, a coupler or sensor 28 may be used to detect a signal level on the input side of amplifiers 14, 16. For example, as shown in the exemplary embodiment of FIG. 1, sensor 28 is coupled to balun input port 10a to couple a portion of the RF input signal to control circuit 24. If the coupled portion of the input signal provided to control circuit 24 indicates that the amplitude of one or both of the RF signals being provided to amplifiers 14, 16 equals or exceeds a predetermined threshold value, then control circuit 24 provides a control signal to bypass circuit 12 such that it operates in its bypass mode. If, on the other hand, the coupled signal provided to control circuit 24 indicates that the amplitude of one or both of the RF signals being provided to amplifiers 14, 16 is less than a predetermined threshold value, then control circuit 24 provides a control signal to bypass circuit 12 such that it operates in its amplifying mode and the RF signals propagate through balun 10 and through bypass circuit 12 to the input ports of amplifiers 14, 16.

Alternatively still, in some embodiments it may be desirable to utilize signals from both the input and output sides of the amplifying devices (e.g. amplifiers 14, 16) to provide an input signal to the control circuit. The input signal to the control circuit can be coupled, derived or otherwise provided from either or both of the input and output sides of the amplifying devices. In some embodiments, the bypass circuit can be manually switched into bypass mode if a user feels as though one or more of the amplifying devices are saturating.

It should be appreciated that the bypass circuit provides the amplifier circuit with a form of gain control. Thus, circuit 8 may be designed to reduce effects of "friendly" signals (e.g. on a ship with multiple radars operating at multiple frequencies and power levels) and the bypass mode can be used to reduce or maintain the signal (e.g. a signal processor) in a desired range of signal levels.

In one embodiment, once amplifiers 14, 16 are selected, the saturation characteristic(s) or other characteristics of the amplifiers 14, 16 are used to determine, at least in part, desired characteristics of the remaining circuits in the system 8.

In one embodiment, input and output baluns 10, 18 are provided as broadband input and output baluns. In one embodiment, each input and output balun may utilize a pair of low impedance coaxial cables (low impedance relative to a system impedance) coupled to each other at the input and output in a way that impedance matches to an unbalanced impedance ($Z_o$) at one end and a balanced impedance of ¼ $Z_o$ (or ⅛ $Z_o$ unbalanced impedance) at the other end.

Such a balun has broadband insertion loss and return loss characteristics, covering a frequency band in the range of HF band to upper C-band. Both radiation and conduction losses are reduced, and sometimes minimized, by the use of coaxial cable.

As will become apparent from the description hereinbelow, the system 8 may contain additional matching circuits coupled between the respective input/output baluns and amplifier input/output ports in order to impedance match to a system characteristic impedance (e.g. fifty (50) ohms).

In one particular embodiment impedance level at the middle of the two baluns is 12.5 Ω balanced. Broadband impedance transforming balun characteristics demonstrated between 0.01 to 2 GHz showing the return loss is better than 15 dB and insertion loss less than 0.4 dB per balun. Balun characteristics which are of significance in this application include, but are not limited to: (a) broadband impedance transformation between the input and output ports (for example, use of two 25 Ω transmission line sections to transform 50 Ω to 12.5 (balanced) or 6.25 Ω (unbalanced)); (b) an RF signal fed to a balun input port is equally split at two output ports with the two output signals being and a fourth balun port is isolated; two 180° out of phase; (c) as a two-way combiner, two RF signals which are 180° out of phase will be combined at the output port but two in-phase signals will be presented with an open impedance and will be reflected.

When the input signals provided to amplifying devices 14, 16 are 180° apart (e.g. due to the input balun), output signals generated by amplifying devices 14, 16 may be expressed as $\sin(\omega t)$ and $\sin(\omega t+\pi)$ (for the fundamental frequency signal) and $\sin(2\omega t)$ and $\sin(2\omega t+2\pi)$ (for the second harmonic frequency signal), respectively. Therefore, two fundamental signals input to the output balun are out of phase and two second harmonic signals are in phase. Fundamental components are combined by the output balun while the second harmonic components are rejected because they are fed in phase into the output balun and the output balun will present an open condition to such signals.

It should be noted that the output balun presents a virtual open circuit impedance characteristic for all even harmonics, but odd harmonics including the fundamental will be combined at the balun output port, if they are within the band. The second harmonic is the most critical for highly efficient operation of the amplifier.

Figure 2:
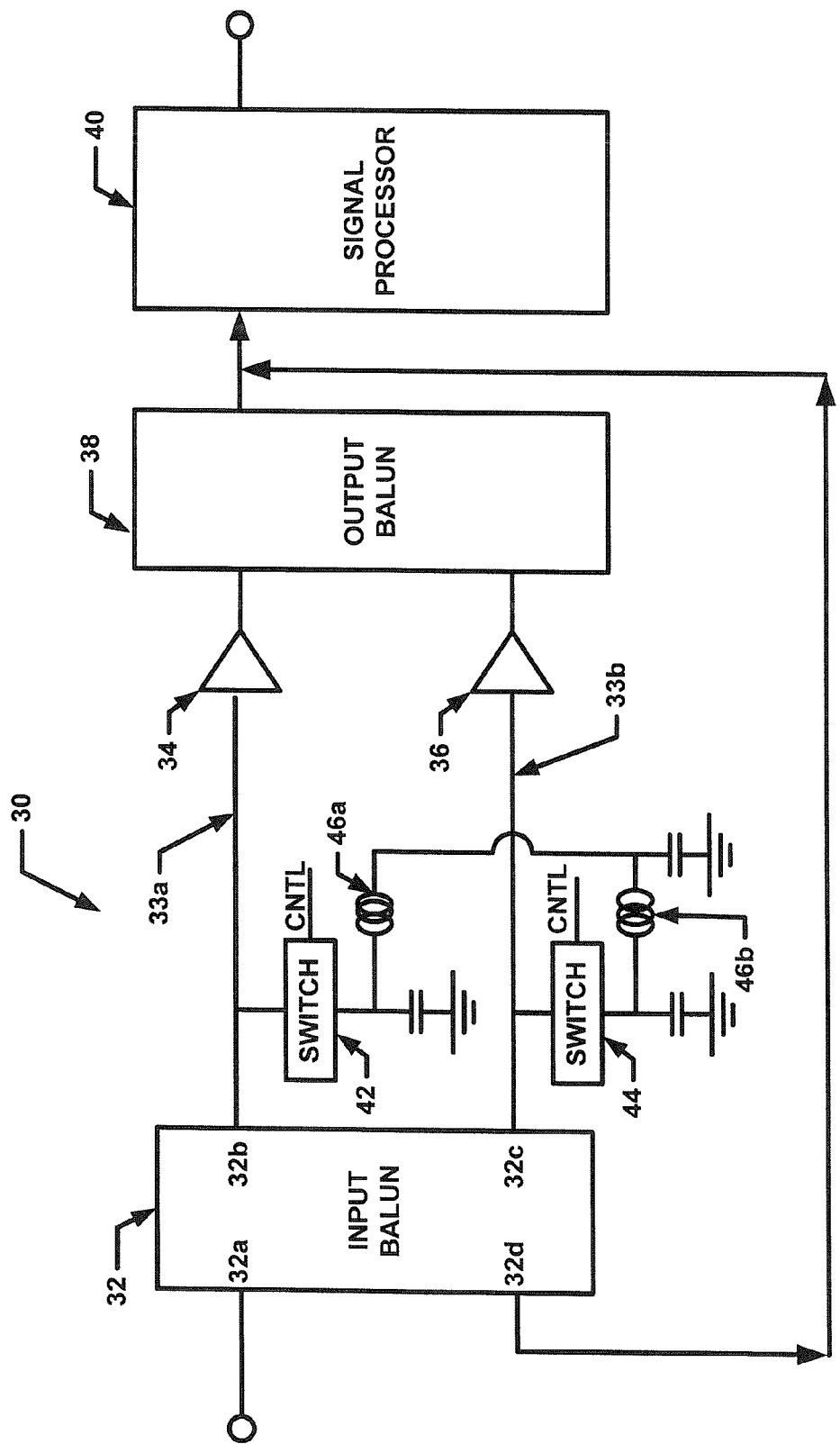
FIG. 2 is a block diagram of an amplifier circuit having input and output baluns and a bypass circuit.

Referring now to FIG. 2, system 30 includes an input balun 32 which may be the same as or similar to balun 10 described above in conjunction with FIG. 1, having an RF input port 32a and ports 32b, 32c coupled through RF signal paths 33a, 33b to RF input ports of respective ones of RF amplifiers 34, 36. Amplifier output ports are coupled through an output balun 38 to a signal processor 40. Switching elements 42, 44 (aka switching devices 42, 44) each have a first terminal 42a, 44a, coupled to a corresponding one of signal paths 33a, 33b, a second terminal 42b, 44b coupled to a first reference potential (here shown as ground) through a capacitor and a control terminal 42c, 44c. RF chokes 46a, 46b are coupled from respective second terminals 42b, 44b to a reference potential, here corresponding to ground. As will become apparent from the description provided herein, switching elements 42, 44 may be provided as any type of electronic switch, for example, from one or more of (or a combination of) one or more diodes, one or more transistors (including one or more field effect transistors) or other two or three terminal devices. Switching elements 42, 44 may also be provided a mechanical switch. It should be appreciated that in embodiments in which switching elements 42, 44 are implemented as transistors (e.g. field effect transistors), then bypass capacitors (shown between switching elements 42, 44 and ground in FIG. 2) are not required. Preferably, switching elements 42, 44 characteristics are selected such that no significant signal degradation occurs in the RF signal path.

In response to control signals provided to respective switch control terminals 42c, 44c, switching elements 42, 44 provide either a high impedance signal path to signals propagating from balun ports 32b, 32c or a low impedance signal path to signals propagating from balun ports 32b, 32c. When switching elements 42, 44 provide a high impedance, RF signals propagate from balun ports 32b, 32c to input ports of respective amplifiers 34, 36. When switching elements 42, 44 provide a low impedance, RF signals are re-directed from balun ports 32b, 32c to by pan port 32d and are then coupled directly to the output port of output balun 38.

Figure 3:
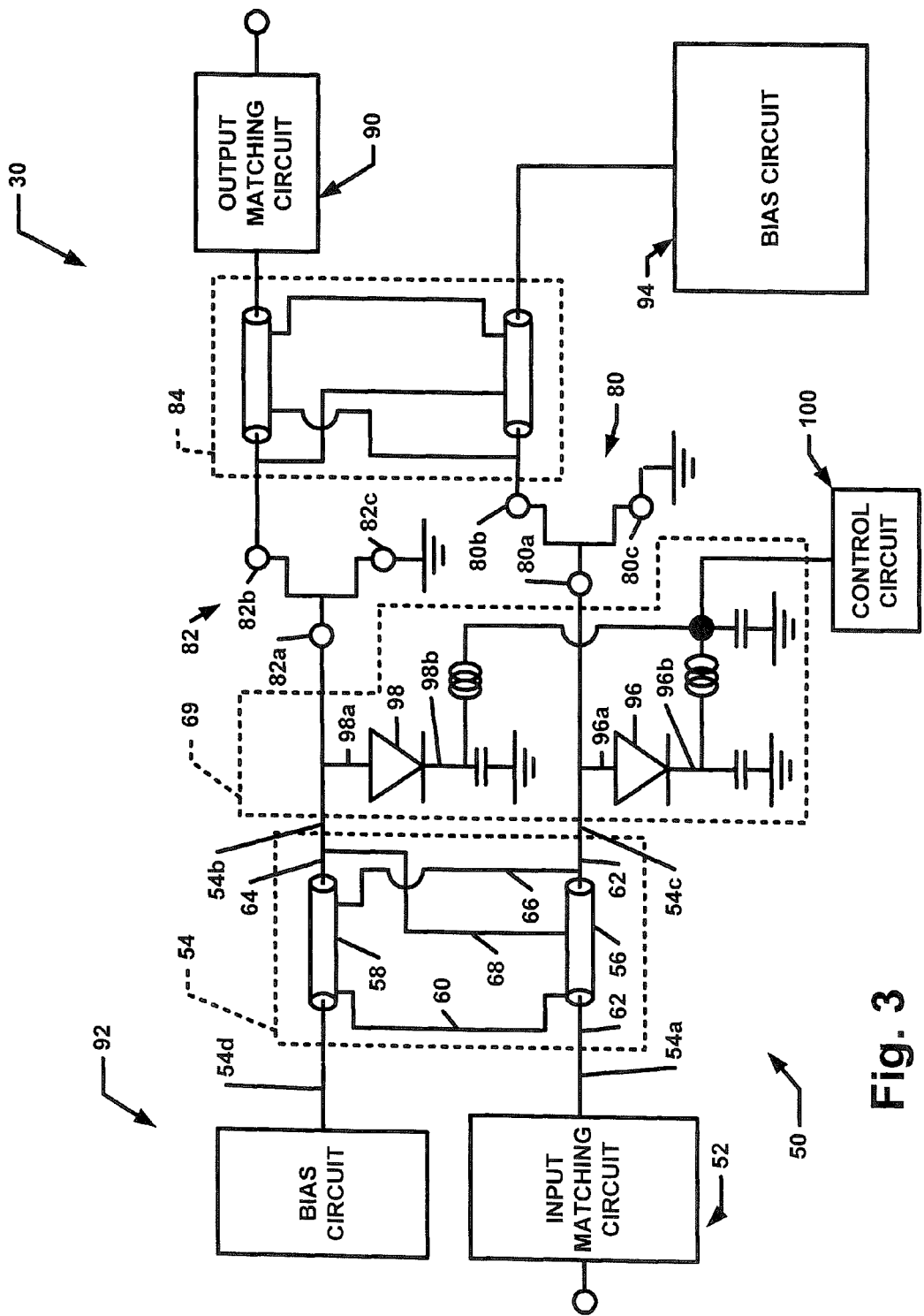
FIG. 3 is a block diagram of an amplifier circuit having input and output baluns, a bypass circuit and a bias circuit.

Referring now to FIG. 3, an amplifier circuit 50 includes an input matching circuit 52 having a first port 52a at which an RF input signal is provided and output port coupled to an RF input port 54a of an input balun 54. Input balun 54 is provided from a pair of coaxial transmission lines 56, 58. Outer conductors of coaxial lines 56, 58 are coupled via conductor 60 and center conductors 62, 64 of respective coaxial lines 56, 58 are coupled to outer conductors of the opposite coaxial line via respective conductors 66, 68.

Baluns 56, 58 are coupled to an input terminal of respective ones of an amplifying devices 80, 82. In this particular embodiment amplifying devices 80, 82 are provided as field effect transistors (FETS) having gate, sources and drain electrodes 80a, 82a, 80b, 82b, 80c, 82c respectively. Thus RF signals propagate to gate electrodes 80a, 82a of FETS 80, 82. FETS 80, 82 amplify the RF signals provided thereto and provide the amplifier signals to respective input ports of an output balun 84. Output balun 84 provides an RF output signal to amplifier output port 50b through output matching circuit 90.

Bias circuits 92, 94 provide bias signals to FETS through input and output balun circuits 54, 84. In particular bias circuit 92 provides a bias voltage to gate terminals 80a, 82a and bias circuit 94 provides a bias voltage to drain terminals 80b, 82b. Source terminals 80c, 82c are coupled to ground.

Diodes 96, 98 each have a first terminal 96a, 98a, coupled to a respective one of signal paths 68, 70 and second terminals 96b, 98b coupled to ground through capacitors. Inductors are coupled between diode terminals 96b, 98b and ground.

A control circuit 100 provides one or more control signals to bias diodes 96, 98 into one of conduction or non-conduction states. In their conduction states, diodes 96, 98 present a short circuit impedance characteristic at the output ports of input balun 54. Thus, in this case, RF signals provided at amplifier input port 52a are directed to balun bypass port 54d and then coupled to amplifier output port 50b. When diodes are biased into their non-conductive states, RF signals fed to input port 52a are coupled through balun 54 to FETS 80, 82.

In one embodiment, when the RF input signal to the amplifying devices (e.g FETs 80, 82) reaches a predetermined level (e.g. such that the RF input signal causes the amplifying devices to reach saturation such as 1 dB compression, 3 dB compression etc. . . . ), then as discussed above, control circuit 100 provides a control signal to diodes 96, 98 such that they are biased into their conduction (aka low impedance) states. This results in a short circuit signal path to ground to RF signals appearing at the output ports 54b, 54c of the input balun 54.

In some embodiments it may be desirable to utilize signals from both the input and output sides of the amplifying devices (e.g. FETs 80, 82) to provide an input signal to the control circuit. In some embodiments, the circuit can be manually switched into bypass mode if a user feels as though one or more of the amplifying devices are saturating.

Figure 4:
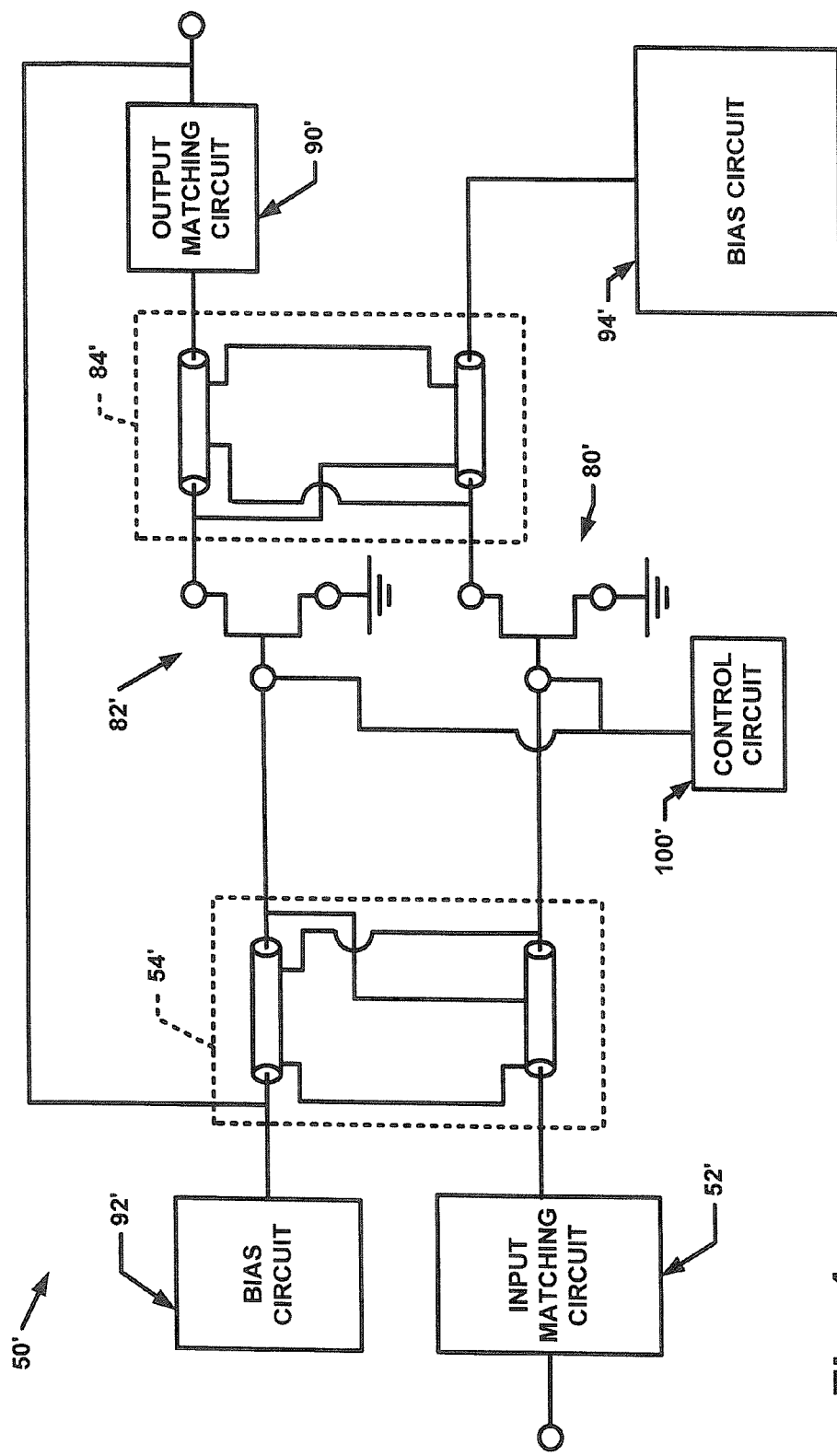
FIG. 4 is a block diagram of an alternate embodiment of an amplifier circuit having input and output baluns, a bypass circuit and a bias circuit.

Referring now to FIG. 4, a circuit 50' includes an input matching circuit 52'; a bias circuits 92', 94', an input balun 54' amplifying devices 80', 82', output balun 84' and an output matching circuit 90' all of which may be the same as or similar to corresponding elements described above in connection with FIG. 3.

In this particular embodiment, however, switching elements (e.g. diodes 96, 98 in FIG. 3) coupled to the output ports of the input balun and which function to provide a low impedance signal path to ground are not included. Rather, in the embodiment of FIG. 4, to bypass the RF signal to the bypass port of the input balun, control circuit 100' provides a control signal to a control terminal of each transistor 80', 82' to "pinch off" the transistors. In one embodiment, this is accomplished by applying a negative voltage to gate electrodes much deeper than the pinch off voltage. The pinched-off transistors 80', 82' will exhibit an open circuit impedance characteristic and thereby reflect the RF signals propagating along the signal path to the balun bypass port.

In one embodiment, transistor 80', 82' can be selected to the short condition by applying 0 V on gate terminals thereof (0 V on the drain). Low impedance condition of transistors 80', 82' will also reflect the signal and the reflected signal will be directed to the input balun bypass port.

Thus, in this configuration, neither switching diodes, nor transistors nor any other additional switching element is required in order to switch between bypass and amplifying modes. This results in a circuit having an insertion loss characteristic which is lower than insertion loss characteristics of conventional amplifier circuits having bypass circuits.

In some embodiments the amplifying devices may be provided as low noise amplifiers (LNAs). In one embodiment, the transistor amplifier can be provided as a TriQuint TGF2023-05 amplifier.

Figure 5:
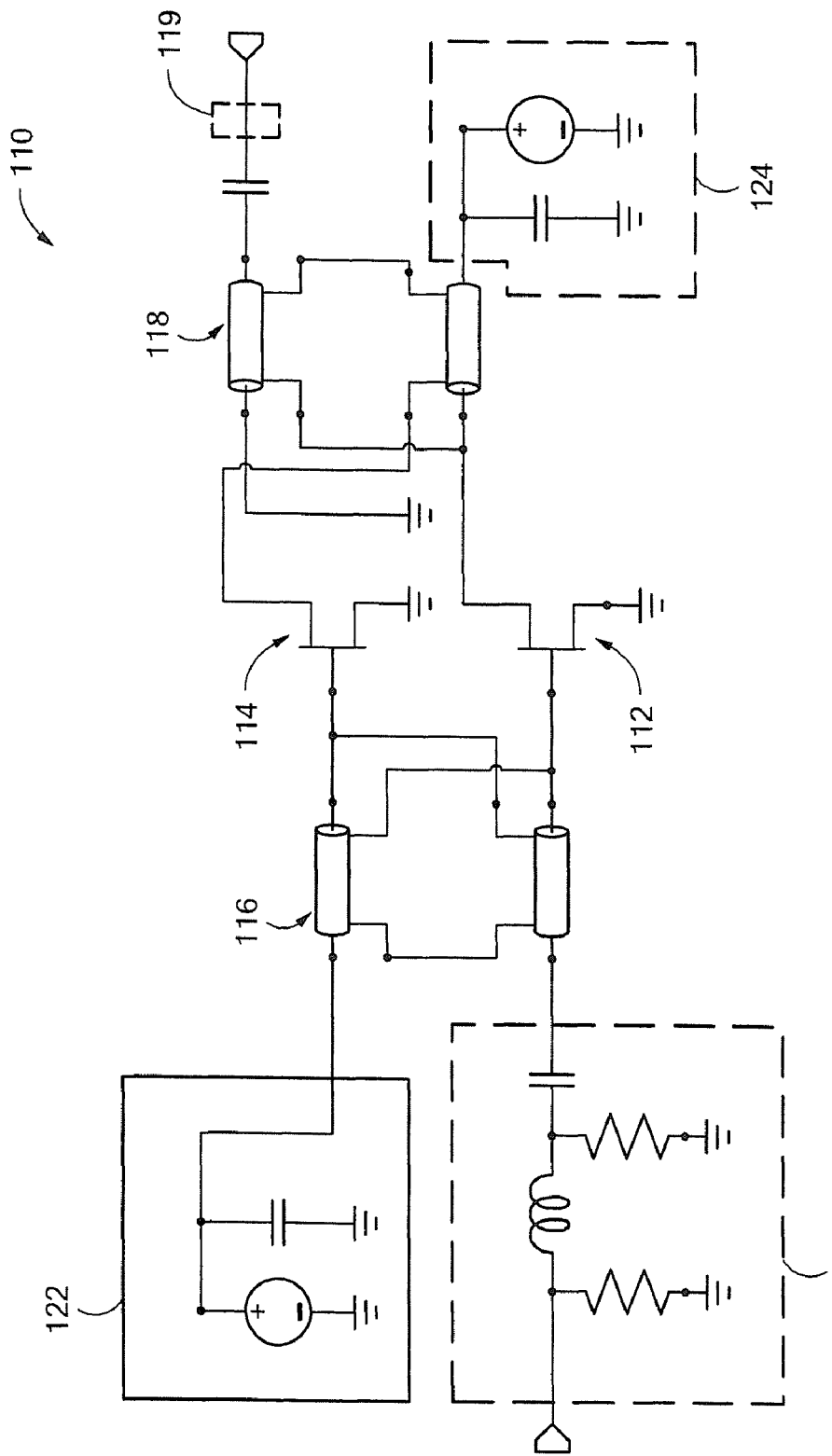
FIG. 5 is a schematic diagram of an amplifier circuit having input and output baluns, a bypass circuit and a bias circuit.

Referring now to FIG. 5, an exemplary broadband power amplifier circuit 110. comprises two amplifying devices 112, 114 (here shown as being provided as two Gallium Nitride (GaN) High Electron Mobility Transistors (HEMTs), each with 6 mm periphery), disposed between two broadband baluns 116, 118.

The circuit includes an input matching circuit 120 disposed between an amplifier input port and an input port of the input balun 116. The input matching circuit substantially matches the input impedances of amplifying devices 112, 114 to a system impedance $Z_O$ which is typically 50 ohms although other characteristic impedances, may of course, also be used.

Amplifier circuit 110 also includes a pair of bias circuits 122, 124 used to implement a bias scheme. Bias circuits 122, 124 provide respective bias signals through respective ones of baluns 116, 118 to amplifying devices 112, 114. It should be appreciated that only one bias port is required for the input and another for output (e.g. bias circuit 122 provides a gate bias voltage to amplifying devices 112, 114 while bias circuit 124 provides source bias voltages to amplifying devices 112, 114). Circuit 110 may also include an optional output matching circuit 119.

A quiescent bias condition is selected near Class AB rather than beyond pinch off, as in the case with a switching amplifier (Class B). It will maintain the gain at small signal because it will render itself to Class AB and maintains linearity at all power levels.

Figure 6:
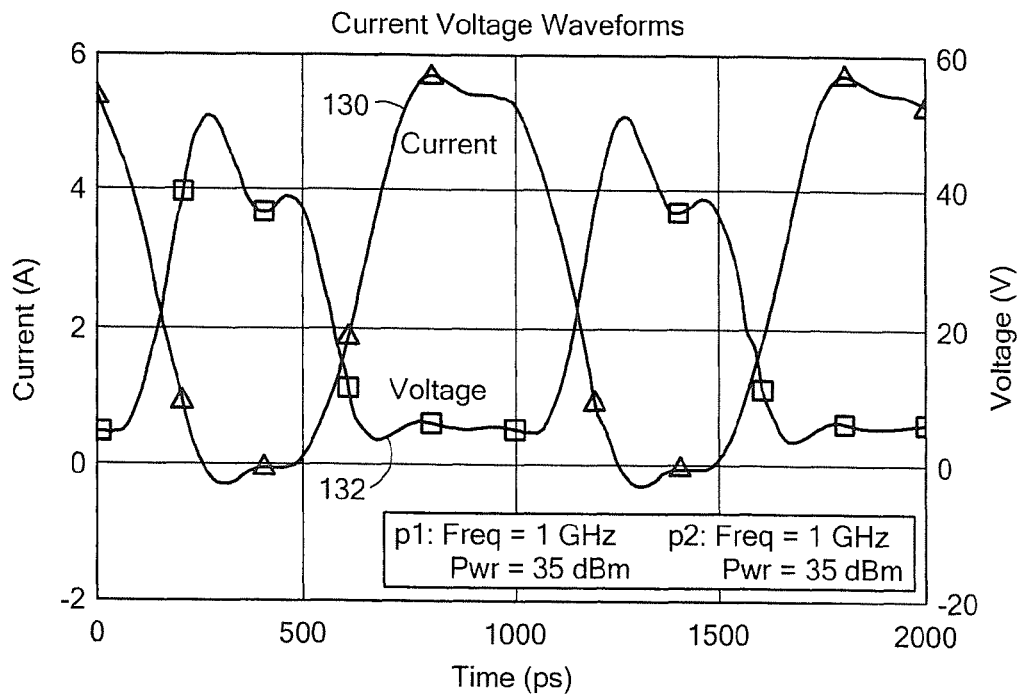
FIG. 6 is a plot of simulated current and voltage vs. time for the amplifier circuit of FIG. 5.

Referring now to FIG. 6, current and voltage wave forms 130, 132 at the device terminal (not at the output port) are shown. As can be seen from FIG. 6, characteristics of inverse Class F where current wave is showing square wave form. Conduction angle (overlap between the current and voltage waveforms) is small, leading to a high efficiency operation.

Figure 6A:
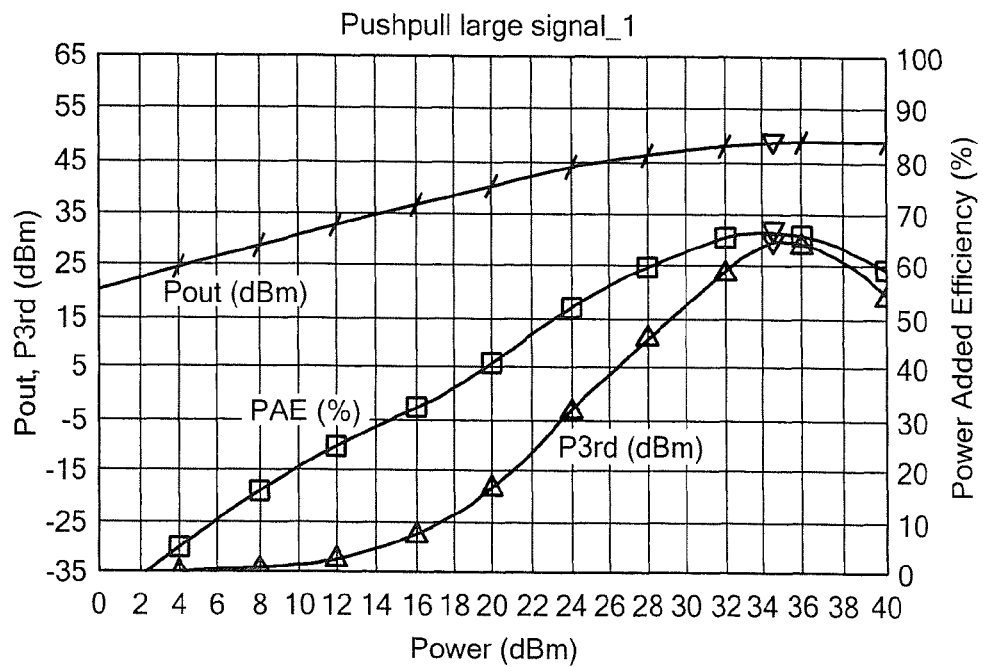
FIG. 6A is a plot of simulated output power (Pout), power added efficiency (PAE) and third harmonic power (P3rd) vs. frequency of the amplifier circuit of FIG. 5.

Referring now to FIG. 6A, simulation results of input versus output power (Pin vs. Pout), $3^{rd}$ order harmonics and power added efficiency of the amplifier at 1 GHz are shown. Output power Pout of about 48 dBm (60 W) and power efficiency of more than 60% is achieved. Note that the second order harmonics are cancelled, but $3^{rd}$ harmonic is calculated and shown in the graph. An added feature of this configuration is that the linearity is improved over Class AB because all the even harmonics are suppressed.

Figure 7:
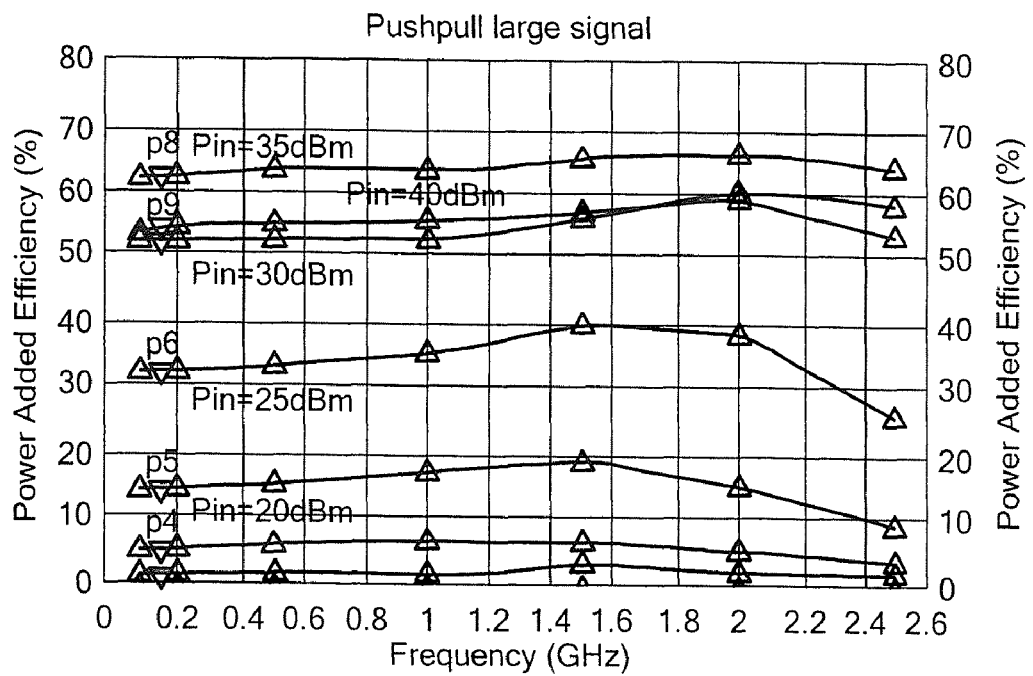
FIG. 7 is a plot of simulated PAE vs. frequency of a power amplifier over a range of different input powers (Pin)
Figure 7A:
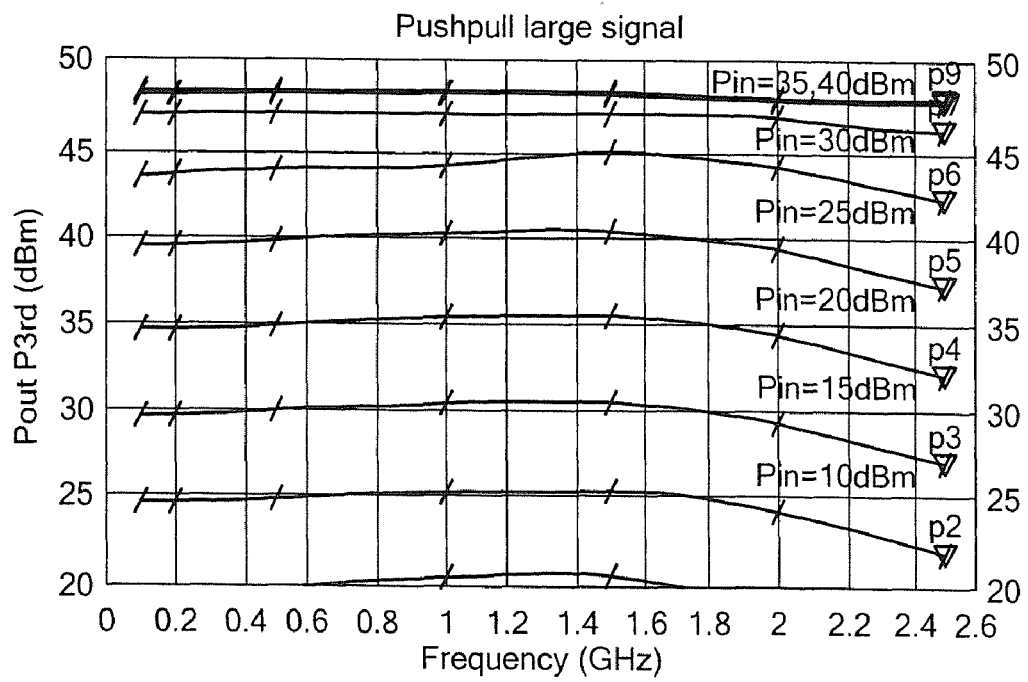
FIG. 7A is a plot of simulated third harmonic output power (Pout, P3rd) in dBm vs. frequency of the amplifier circuit of FIG. 5 over a range of different input powers (Pin)

Referring now to FIG. 7, the power added efficiency of the amplifier shown in FIG. 4 is shown and FIG. 7A shows output power over a frequency band of 0.1 GHz to 2.5 GHz. These graphs demonstrate that Inverse Class F operation may be realized over a decade band in which high efficiency and high power are maintained. Over this band the efficiency is above 60% while output power is 48 dBm (60 W).

Figure 8:
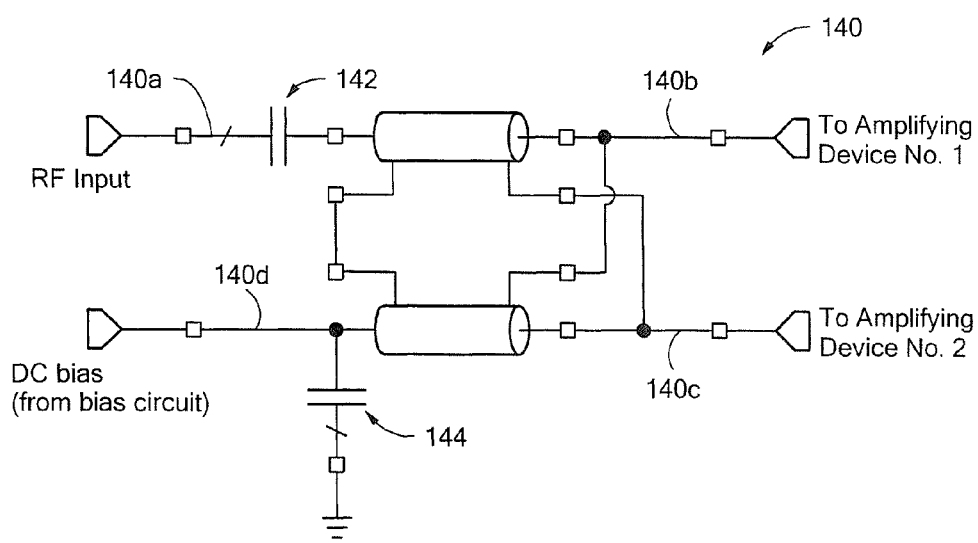
FIG. 8 is a schematic diagram of a circuit to provide a bias signal though a balun.

Referring now to FIG. 8, a balun circuit 140 through which a bias supply signal (e.g. a bias voltage) may be provided to a pair of amplifying devices is shown. As shown in FIG. 8, the balun circuit 140 has a first port 140a adapted to receive an RF input signal. The RF input signal is coupled through a DC blocking capacitor 142 and is split into two signals having equal amplitudes and having a 180 degree phase difference at balun output ports 140b, 140c (i.e. the two equal amplitude signals are 180 degrees out of phase at the balun output ports). The balun output ports are coupled to respective ones of first and second amplifying devices (not shown in FIG. 8).

A DC bias circuit (also known as a DC bias source) provides a bias signal (e.g. a bias voltage) to balun input port 140d. The bias signal is coupled through balun 140 to the first and second amplifying devices. Thus, in this way, bias signals maybe provided to first and second amplifying devices through balun 140. An RF ground capacitor 144 has a first terminal coupled to the same balun input 140d as the DC bias source and a second terminal coupled to a reference potential (which in FIG. 7 corresponds to ground).

In operation, in response to an RF signal fed to RF input 140a, balun 140 provides fundamental components of RF output signals which are 180° out of phase to two amplifying devices (not shown in FIG. 8). Second harmonic signal components, on the other hand, are in-phase. When these fundamental and second harmonic signals are injected to a second balun (e.g. output balun 118 described above in conjunction with FIG. 4), the fundamental signal will be combined at the output port and will be sent to the load presented at the port. The balun however presents an open circuit impedance characteristic to the second harmonic signals and thus these signals will not appear at the output port of the second balun. Similarly, the second harmonic generated by the device and returned to the input balun will be presented to an open circuit impedance condition. Therefore, with this particular arrangement, an amplifier having a second harmonic open circuit impedance at both input and output ports for any point in an operating frequency band is provided.

In one embodiment, balun 140 is provided from a pair of coaxial cables connected to each other at the input and output in a way that impedance matches to an unbalanced characteristic impedance ($Z_o$) at one end and a balanced impedance of ¼ $Z_o$ (or ⅛ $Z_o$ unbalanced impedance) at the other end. It should be noted (and as described above in conjunction with FIG. 5) that in such an embodiment, bias voltages can be provided to a pair of amplifying devices through single ports of input and output baluns.

Figure 9:
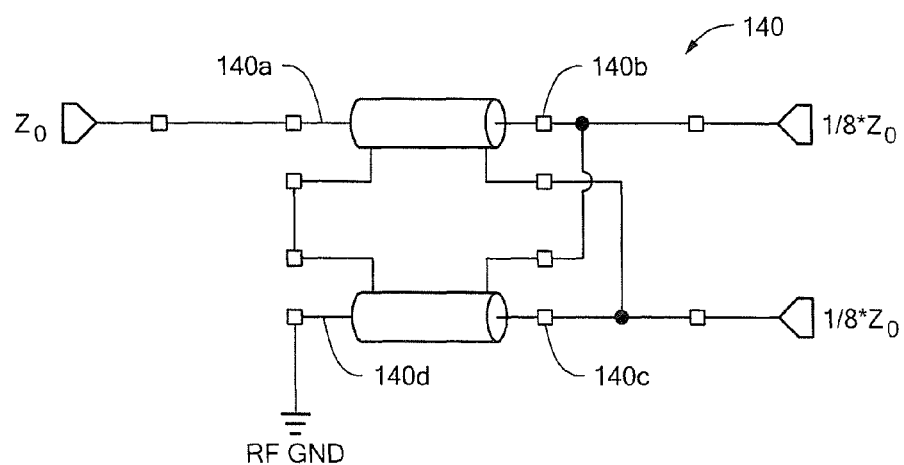
FIG. 9 is a schematic diagram illustrating an impedance transformation provided by a balun.

Referring now to FIG. 9, in which like elements of FIG. 8 are provided having like reference designations, the RF ground capacitor 144 (shown in FIG. 8) provides a low impedance signal path to ground for RF signals propagating toward balun port 140d. Thus capacitor 144 couples a first end of one balun arm to ground and with the balun arms coupled as shown in FIG. 9, balun 1400 acts as a ⅛ impedance transformer. Thus, designating balun port 140a as an RF input port and designating balun ports 140b, 140c as balun output ports, and with a system characteristic impedance $Z_0$ the RF impedance at balun output ports is ⅛ $Z_0$.

Figure 10:
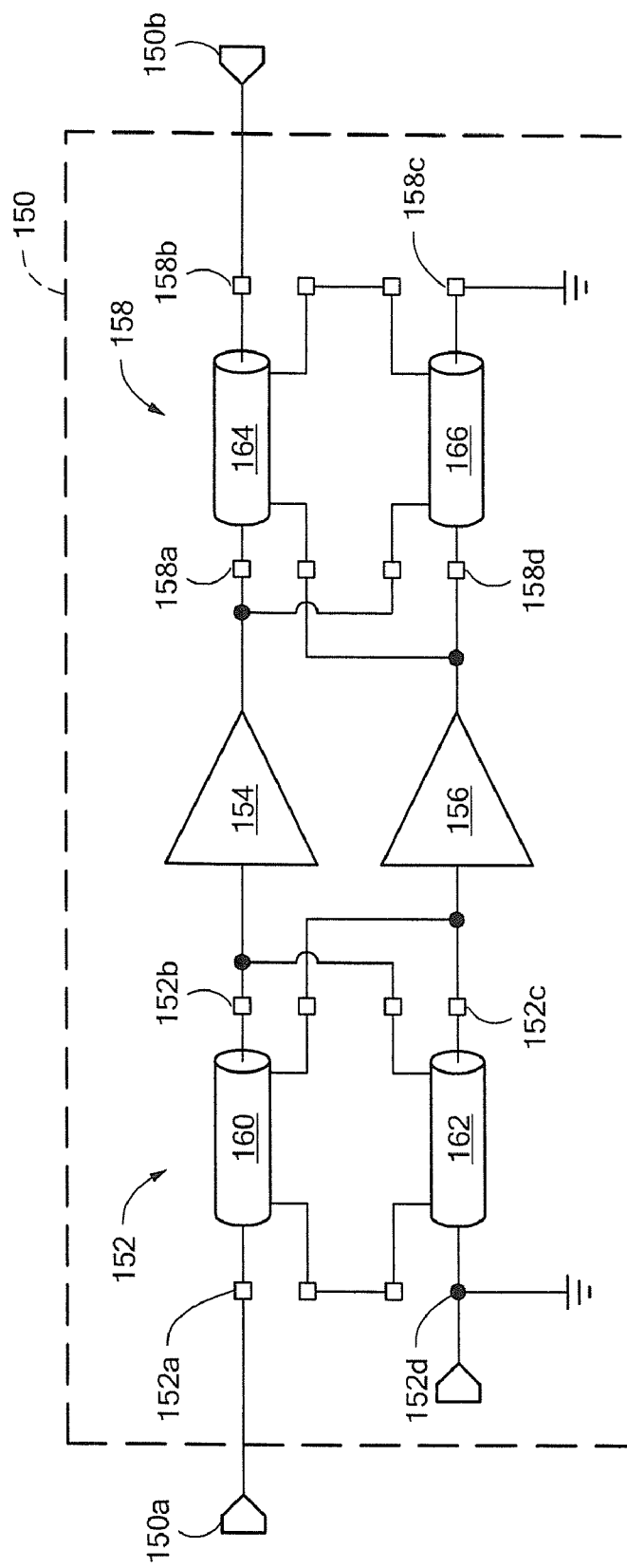
FIG. 10 is a block diagram of a push pull amplifier circuit having an input port, an output port and a bypass port when the amplifier is configured in an amplifying mode.

Referring now to FIG. 10, an amplifier circuit 150 has an input port 150a configured to receive a radio frequency (RF) input signal and an output port 150b at which an output RF input signal is provided. Amplifier circuit includes an input balun 152 having a first port 152a coupled amplifier input port 150a, a second port 152b coupled to an input port of a first amplifier 154, a third port 152c coupled to an input port of a second amplifier 156 and a fourth port coupled to a reference potential, here corresponding to ground. In response to an RF signal provided to input balun port 152a, balun 152 provides at ports 152b, 152c RF signals having equal amplitudes and which are 180 degrees out of phase Amplifier 150 also includes an output balun 158 having a first port 158a coupled to an output of amplifier 154, a second port 152b coupled to the amplifier circuit output port 150b, a third port 154c coupled to a reference potential, here corresponding to ground, and a fourth port coupled to an output port of the second amplifier 156. In response to RF signals having equal amplitude and being 180 degrees out of phase being presented at balun ports 158a, 158d, balun 158 provides at output balun port 158b, an amplified version of the RF signal provided to input balun port 152a.

Thus, when configured as shown in FIG. 10, an RF signal fed to amplifier circuit input port 150a is amplified and provided at amplifier circuit output port 150b. Substantially no RF signal is provided to balun ports 152d, 158c and thus these ports are said to be isolated from input port 150a.

In the embodiment of FIG. 10, balun 152, is provided from a pair of coaxial lines 160, 162 coupled as shown. The input signals to the two amplifying devices 154, 156 are equal amplitude and 180 degrees out of phase due to input balun 152. Output balun 158 is also provided from a pair of coaxial lines 164, 166 coupled as shown. Significantly, for operation in the amplifying mode, balun terminal 152d is coupled to ground as is output balun terminal 158c.

Figure 11:
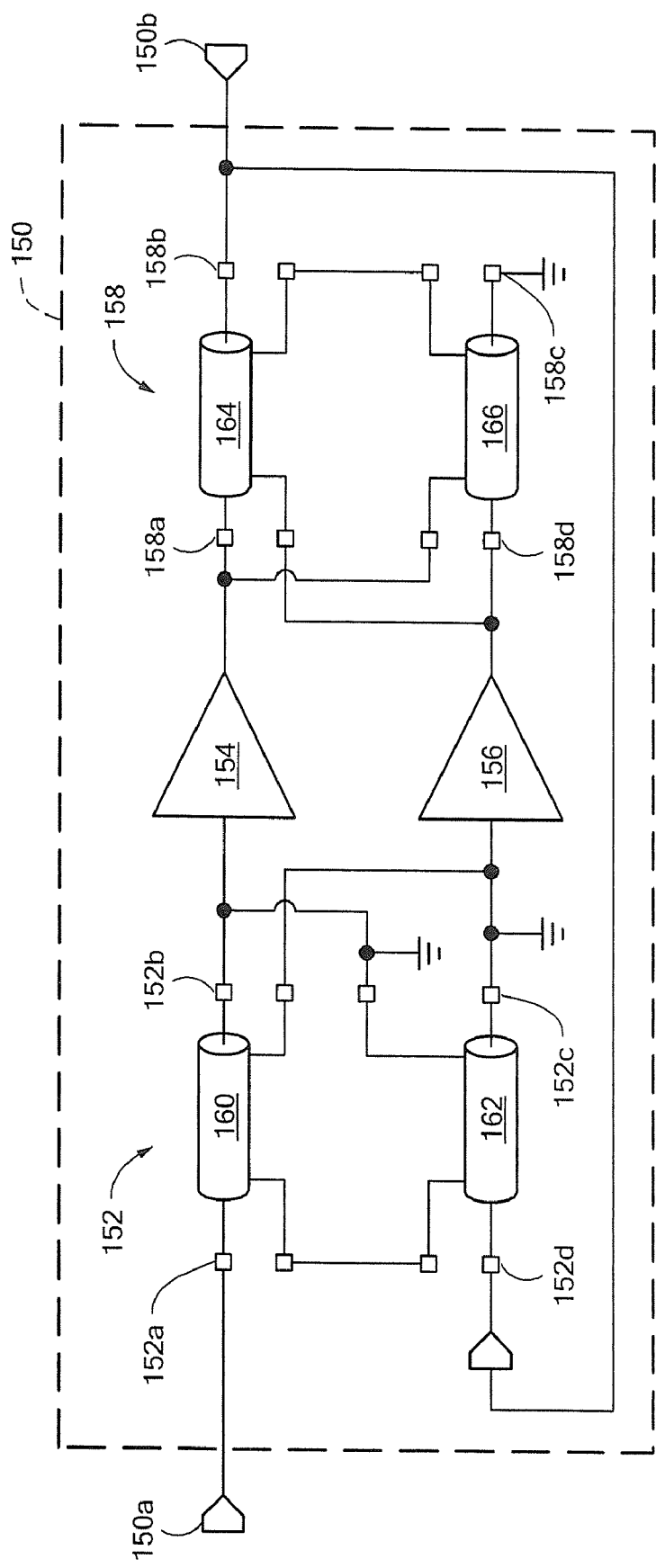
FIG. 11 is a block diagram of a push pull amplifier circuit having an input port, an output port and a bypass port when the amplifier is configured in a bypass mode.

Referring now to FIG. 11, in which like elements of FIG. 10 are provided having like reference designations, amplifier circuit 150 is configured in a so-called bypass mode.

For operation in the bypass mode, balun ports 152b and 152c are both coupled to ground while ground is removed from balun terminal 152d. The configuration of balun 158 remains same as shown and described in FIG. 10. With this configuration, an RF signal fed to input port 150a is coupled to bypass port 152d and then coupled amplifier circuit output port 150b. Thus, no RF signal is fed to amplifying devices 154, 156 and thus amplifying devices 154, 156 are said to be by-passed.

The concepts, circuits and techniques described above at least in conjunction with FIGS. 1-5 (e.g. using a combination of switches and ground connections) can be used to provide the removable couplings to ground between ports 152b-152d. Thus, amplifier circuit 150 can operate in either an amplifying mode (as shown and described in conjunction with FIG. 10) or in a bypass mode (as shown and described in conjunction with FIG. 11).

It should be appreciated that in the techniques described herein, broadband input and output baluns are coupled (directly connected as shown in the exemplary embodiment of FIGS. 1 and 2) to the input and output of the device. In one embodiment, each input and output balun may utilize a pair of low impedance coaxial cables connected to each other at the input and output in a way that impedance matches to an unbalanced characteristic impedance ($Z_o$) at one end and a balanced characteristic impedance of ¼ $Z_o$ (or ⅛ $Z_o$ unbalanced impedance) at the other end. It should be noted that in this embodiment, only one bias port each for input and output can feed bias voltages to both devices through the balun in this configuration.

Such a balun has very broadband characteristics, covering HF to upper C-band. Both radiation and conduction losses are minimized by the use of coaxial cable. The amplifier may contain additional matching circuits in between the baluns and input/output ports in order to make the impedances matched to the system impedance which is typically 50 ohms.

The amplifier may contain additional matching circuits in between the balun and amplifying devices in order to adjust the device impedance to the baluns.

Figure 12:
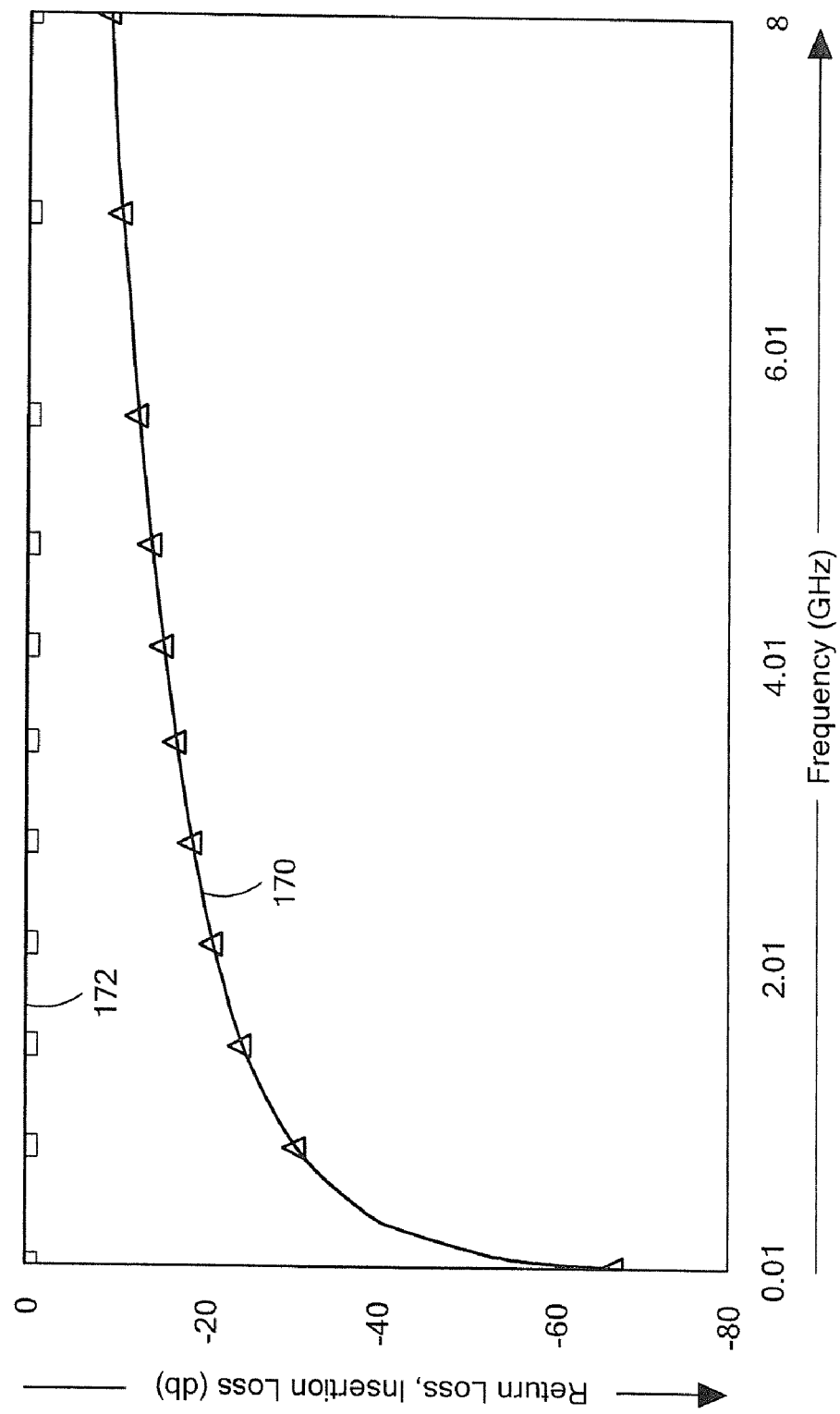
FIG. 12 is a plot of measured return loss and insertion loss characteristics of a push pull amplifier circuit operating in a bypass mode as described in conjunction with FIG. 11.

Referring now to FIG. 12, a plot of insertion loss and return loss versus frequency for an amplifier circuit operating under bypass mode, which may be the same as or similar to amplifier circuits described above in conjunction with FIG. 11 is shown. Curve 170 shows a return loss at the input port 150a of better than 20 decibels (dBs) through a frequency of about 2.01 GHz while curve 172 illustrates an insertion loss between ports 150a-150b of less than 0.5 dB up to a frequency of about 8 GHz.

Having described preferred embodiments which serve to illustrate various concepts, circuits and techniques which are the subject of this patent, it will now become apparent to those of ordinary skill in the art that other embodiments incorporating these concepts, circuits and techniques may be used. For example, described herein is a specific exemplary circuit topology and specific circuit implementation for achieving a desired performance. It is recognized, however, that the concepts and techniques described herein may be implemented using other circuit topologies and specific circuit implementations. Accordingly, it is submitted that that scope of the patent should not be limited to the described embodiments but rather should be limited only by the spirit and scope of the following claims.

What is claimed is:

1. An amplifier circuit having an input port and an output port, the amplifier circuit comprising
    a pair of amplifying devices, each of the amplifying devices having an input and an output;
    an input balun having an input port coupled to the input port of the amplifier circuit and having first and second output ports coupled to respective ones of the input ports of said pair of amplifying devices and having a bypass port;
    an output balun having first and second input ports coupled to respective ones of the output ports of said pair of amplifying devices and having an output port coupled to the output port of the amplifier circuit;
    a bypass circuit coupled to the first and second output ports of said input balun and configured to selectively present first and second impedance characteristics to the first and second output ports of said input balun such that in response to the first impedance characteristic, RF signals fed to the input port of said input balun are coupled to respective ones of said first and second amplifying devices and in response to the second impedance characteristic, RF signals fed to the input port of said input balun are coupled to the bypass port of said input balun;
    an RF signal path coupled between the bypass port of said input balun and the output port of the amplifier circuit; and
    a control circuit coupled to said bypass circuit, said control circuit for receiving at least one input signal, the at least one input signal corresponding to at least one of: a feedback signal; or a coupled signal and in response to at least one signal characteristic of the at least one of the feedback signal or coupled signal having a value above a threshold value, said control circuit provides a signal having a first value to said bypass circuit switch element and in response to at least one signal characteristic of the at least one of the feedback signal or coupled signal having a value below a threshold value, said control circuit provides a signal having a second value to said bypass circuit.

2. The amplifier circuit of claim 1 wherein said bypass circuit comprises a switch element having a first terminal, a second terminal and a control terminal with the first terminal of said switch element coupled to the first and second output ports of said input balun, the second terminal coupled to a reference potential and wherein in response to the control terminal receiving a control signal having a first value, said switch element couples the first and second output ports of said input balun to the reference potential.

3. The amplifier circuit of claim 2 wherein the reference potential is ground.

4. The amplifier circuit of claim 2 wherein said switch element comprises:
    a first diode coupled between the first output port of said input balun and ground; and
    a second diode coupled between the second output port of said input balun and ground and wherein in response to the first and second diodes being biased into their conductive states, the first and second output ports of said input balun are coupled to ground.

5. The amplifier circuit of claim 2 wherein said switch element comprises:
    a first transistor coupled between the first output port of said input balun and ground; and
    a second transistor coupled between the second output port of said input balun and ground and wherein in response to the first and second transistors being biased into their conductive states, the first and second output ports of said input balun are coupled to ground.

6. The amplifier circuit of claim 1 wherein the at least one input signal is provided from at least one of:
   a signal on the input side of said pair of amplifying devices; or
   a signal on the output side of said pair of amplifying devices.

7. An amplifier circuit having an input port and an output port, the amplifier circuit comprising:
   a pair of amplifying devices, each of the amplifying devices having an input and an output;
   an input balun having an input port coupled to the input port of the amplifier circuit, a first output port selectively coupled to the input of a first one of said pair of amplifying devices, a second output port selectively coupled to the input of a second one of said pair of amplifying devices and a bypass port selectively coupled to the output port of the amplifier circuit; and
   an output balun having a first input port coupled to the output of the first one of said pair of amplifying devices, a second input port coupled to the output of the second one of said pair of amplifying devices and having an output port coupled to the output port of the amplifier circuit; and
   a bypass circuit coupled to the first and second output ports of said input balun, said bypass circuit configured to selectively present first and second impedance characteristics to the output ports of said input balun such that in response to the first impedance characteristic, the first and second output ports of said input balun are coupled to respective ones of said first and second amplifying devices and in response to the second impedance characteristic, the first and second output ports of said input balun are de-coupled from respective ones of said first and second amplifying devices and the bypass port of said input balun provides an RF signal path to the output port of the amplifier circuit; and
   a control circuit coupled to said bypass circuit, said control circuit for receiving at least one input signal, the at least one input signal corresponding to at least one of: a feedback signal; or a coupled signal and in response to at least one signal characteristic of the at least one of the feedback signal or coupled signal having a value above a threshold value, said control signal provides a signal having a first value to said bypass circuit switch element and in response to at least one signal characteristic of the at least one of the feedback signal or coupled signal having a value below a threshold value, said control signal provides a signal having a second value to said bypass circuit.

8. The amplifier circuit of claim 7 wherein said bypass circuit comprises a switch element having a first terminal, a second terminal and a control terminal with the first terminal coupled to the first and second output ports of said input balun, the second terminal coupled to a reference potential and wherein in response to the control terminal receiving a control signal having a first value, said switch element couples the first and second output ports of said input balun to the reference potential.

9. The amplifier circuit of claim 8 wherein the reference potential is ground.

10. The amplifier circuit of claim 8 wherein said switch element comprises:
   a first diode coupled between the first output port of said input balun and ground; and
   a second diode coupled between the second output port of said input balun and ground and wherein in response to the first and second diodes being biased into their conductive states, the first and second output ports of said input balun are coupled to ground.

11. The amplifier circuit of claim 8 wherein said switch element comprises:
   a first transistor coupled between the first output port of said input balun and ground; and
   a second transistor coupled between the second output port of said input balun and ground and wherein in response to the first and second transistors being biased into their conductive states, the first and second output ports of said input balun are coupled to ground.

12. The amplifier circuit of claim 7 wherein each of said pair of amplifying devices corresponds to a field effect transistor (FET) having gate, source and drain electrodes and wherein said bypass circuit comprises a control circuit coupled to the gate electrodes of each of said FETs and wherein in response to said control circuit providing a control signal to the gate electrodes of each FET such that the FETs operates in a pinch-off transistor mode in which the FETs exhibit an open circuit impedance characteristic and thereby reflect the RF signal propagating along the RF signal path to the input balun bypass port.

13. An amplifier circuit having an input port and an output port, the amplifier circuit comprising
   a pair of amplifying devices, each of the amplifying devices having an input and an output,
   a first balun having an input port coupled to the input port of the amplifier circuit, a first output port coupled to the input of a second one of said pair of amplifying devices and
   a second output port end coupled to the input of a first one of said pair of amplifying devices;
   a second balun having a first input port coupled to the output of the first one of said pair of amplifying devices, a second output port coupled to the output of the second one of said pair of amplifying devices and having an output port coupled to the output port of the amplifier circuit wherein the first and second baluns are configured to present an open circuit impedance characteristic to signals having a frequency corresponding to a second harmonic frequency even when the second harmonic frequency is within an operating frequency band of a fundamental frequency of the amplifier circuit; and
   a first bias circuit having a bias output port coupled to a first balun port such that said first bias circuit provides a first bias signal to a first terminal of each of said pair of amplifying devices.

14. The amplifier circuit of claim 13 further comprising a second bias circuit having a bias output port coupled to a second different balun port such that said second bias circuit provides a second bias signal to a second different terminal of each of said pair of amplifying devices.

15. The amplifier circuit of claim 14 wherein said first terminal corresponds to one of a gate, source or drain terminal of each of said pair of amplifying devices and said second terminal corresponds to a different one of a gate, source or drain terminal of each of said pair of amplifying devices.

* * * * *